(12) United States Patent
Zheng

(10) Patent No.: US 6,195,303 B1
(45) Date of Patent: Feb. 27, 2001

(54) CLOCK-BASED TRANSPARENT REFRESH MECHANISMS FOR DRAMS

(75) Inventor: Hua Zheng, Fremont, CA (US)

(73) Assignee: Winbond Electronics Corporation, San Jose, CA (US)

( * ) Notice: Subject to any disclaimer, the term of this patent is extended or adjusted under 35 U.S.C. 154(b) by 0 days.

(21) Appl. No.: 09/427,150

(22) Filed: Oct. 25, 1999

(51) Int. Cl.$^7$ ........................................ G11C 7/00
(52) U.S. Cl. ............................ 365/222; 365/233
(58) Field of Search ............................... 365/222, 233, 365/230.02, 230.03

(56) References Cited

U.S. PATENT DOCUMENTS

| | | | |
|---|---|---|---|
| 5,193,072 | 3/1993 | Frenkil et al. | 365/222 |
| 5,335,201 | 8/1994 | Walther et al. | 365/222 |
| 5,627,791 | 5/1997 | Wright et al. | 365/222 |
| 5,798,976 | * 8/1998 | Arimoto | 365/222 |
| 5,818,777 | * 10/1998 | Seyyedy | 365/222 |
| 5,835,401 | * 11/1998 | Green et al. | 365/222 |
| 5,835,937 | 11/1998 | Miyoshi | 711/106 |
| 5,873,114 | 2/1999 | Rahman et al. | 711/106 |
| 5,881,011 | 3/1999 | Son | 365/222 |

* cited by examiner

Primary Examiner—Son Mai
(74) Attorney, Agent, or Firm—Dinh & Associates

(57) ABSTRACT

A refresh control circuit for a DRAM that includes a timing circuit, a control logic, an address generator, and a multiplexer. The timing circuit provides a refresh enable signal that can be based on, for example, one or more received operational signals (e.g., CLK or CKE) or a device idle signal. The control logic receives the refresh enable signal and a command control signal and provides a refresh control signal. The address generator receives the refresh control signal and provides a refresh address. The multiplexer receives the refresh address and an external address and provides one of the received addresses as an output address. The refresh control circuit initiates refresh of selected memory cells within the DRAM in time periods between memory accesses of the DRAM. The refresh control circuit can support a memory refresh concurrent with a memory access. Other embodiments of the refresh control circuit are also provided.

41 Claims, 7 Drawing Sheets

CLOCK-BASED TRANSPARENT REFRESH MECHANISMS FOR DRAMS

BACKGROUND OF THE INVENTION

The present invention relates generally to integrated circuits, and more articularly to clock-based, transparent refresh dynamic random access memories (DRAMs).

Dynamic random access memories often include a large number of memory cells, each of which is typically implemented with a capacitor coupled to a bit line via a switch. The capacitor holds a charge that is indicative of the data value being stored. By selectively coupling the capacitor to the bit line, the charge stored on the capacitor can be detected and the data value ascertained.

Due to various physical phenomenons, the charge stored on the memory cell capacitor slowly leaks over time. To avoid loss of data, the capacitor is periodically refreshed (or recharged) to a full value. Failure to refresh the memory cell within a particular time period (sometimes referred to as a critical time period) can lead to sufficient loss of charge from the capacitor such that the correct data value cannot be accurately ascertained.

Several schemes have been developed to systematically refresh memory cells in a DRAM. A command refresh scheme performs refresh of specific sections of the DRAM upon receiving a refresh command. A self-refresh scheme performs refresh of the DRAM based on self-initiated action. Both of these schemes typically require the DRAM to stop its activities while doing the refresh. Since the DRAM often includes a large number of rows and the refresh is sometimes staggered for various considerations (i.e., power consumption), the overhead to perform refresh can consume a noticeable percentage of the available operating time, which translates to a reduction in the data bandwidth.

Accordingly, efficient DRAM refresh schemes are highly desirable.

SUMMARY OF THE INVENTION

The invention provides clock-based "transparent" refresh mechanisms for (e.g., synchronous) DRAM. In the transparent refresh mode, the DRAM internally and periodically generates a command to refresh while it is operating in normal manner and servicing memory accesses. The refresh command can be generated based on a clock signal or other control signals provided to the DRAM. Transparent refreshes are performed on the memory cells within a critical time period before the risk (i.e., probability) of data loss due to cell capacitor leakage exceeds a particular threshold.

An embodiment of the invention provides a refresh control circuit for a DRAM that includes a timing circuit, a control logic, an address generator, and a multiplexer. The timing circuit provides a refresh enable signal that can be based on, for example, one or more received operational signals (e.g., a clock signal CLK, a clock enable signal CKE, or others) or an idle signal that indicates that the DRAM is idle. The control logic receives the refresh enable signal and a command control signal and provides a refresh control signal. The address generator receives the refresh control signal and provides a refresh address. The multiplexer receives the refresh address and an external address and provides one of the received addresses as an output address. The refresh control circuit initiates refresh of selected memory cells within the DRAM in time periods between memory accesses of the DRAM.

The refresh control circuit can further include a command decoder and a comparator. The command decoder receives an external command signal and generates the command control signal that indicates a memory access of the DRAM. The comparator receives the external address and the refresh address and generates an indicator signal that indicates whether the received addresses are the same.

Another embodiment of the invention provides a refresh control circuit for a DRAM that includes a timing circuit coupled to at least one row control circuit. The timing circuit provides a refresh enable signal. Each row control circuit receives the refresh enable signal and a command control signal and provides a respective output address. Each row control circuit includes a control logic, an address generator, and a multiplexer that operate in a manner similar to that described above. Each row control circuit can further include a comparator that also operates in a manner similar to that described above. The refresh control circuit can initiate refresh of selected memory cells within the DRAM in time periods between memory accesses of the DRAM.

In a specific implementation of this embodiment, the refresh control circuit includes two or more row control circuits that are capable of providing, when enabled, refresh addresses to respective sections of the DRAM associated with the row control circuits. Each row control circuit can be associated with, for example, a bank of memory or a block of memory. The comparator in each row control circuit provides a respective indicator signal that indicates whether the refresh address generated by that row control circuit is the same as the external address.

Yet another embodiment of the invention provides a memory device that includes a row decoder, a column decoder, a number of memory arrays, and a refresh control circuit. The row and column decoders respectively receive first and second portions of address information and generate first and second sets of control signals, respectively. The memory arrays couple to the row and column decoders and provide one or more data values in response to the first and second sets of control signals. The refresh control circuit couples to the row decoder and provides the first portion of address information for memory accesses and refresh operations. The refresh control circuit initiates refresh of selected memory cells within the memory device in time periods between memory accesses. The refresh control circuit can be implemented using, for example, any of the embodiments described above.

Another embodiment of the invention provides a method for performing refresh of a memory cell within a memory circuit. In accordance with the method, a refresh enable signal is generated within the memory circuit and in time periods between memory accesses of the memory circuit. A refresh control signal is generated in response to the refresh enable signal and a command control signal. A refresh address is generated based, in part, on the refresh control signal. The refresh address indicates the locations of memory cells to be refreshed. Either the refresh address or an external address is then selected and provided as an output address.

For the above embodiments, the refresh enable signal can be activated: (1) periodically based on a received clock signal, (2) by an idle signal that indicates that the memory device is idle, (3) by an external command to refresh, by other mechanisms, or by a combination thereof.

The foregoing, together with other aspects of this invention, will become more apparent when referring to the following specification, claims, and accompanying drawings.

DESCRIPTION OF THE SPECIFIC EMBODIMENTS

Figure 1:
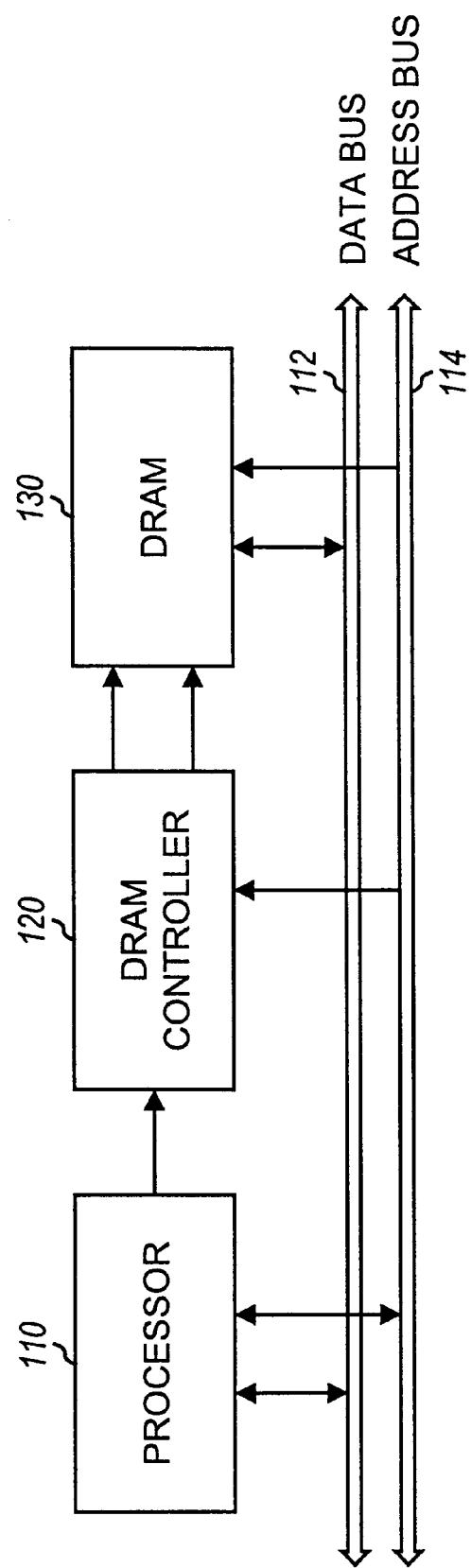
FIG. 1 shows a simplified block diagram of a generic computing system.

FIG. 1 shows a simplified block diagram of a generic computing system 100. A processor 110 couples to a data bus 112 and an address bus 114 for respectively transferring data and address information with other components coupled to the buses. Processor 110 further couples to, and provides instructions to, a DRAM controller 120 that decodes the instructions and provides decoded commands to a DRAM 130. DRAM 130 couples to controller 120 and buses 112 and 114, receives commands from controller 120, and performs the functions indicated by the commands. When directed, DRAM 130 provides data to, or receives data from, the data bus corresponding to the address(es) provided on the address bus.

Figure 2:
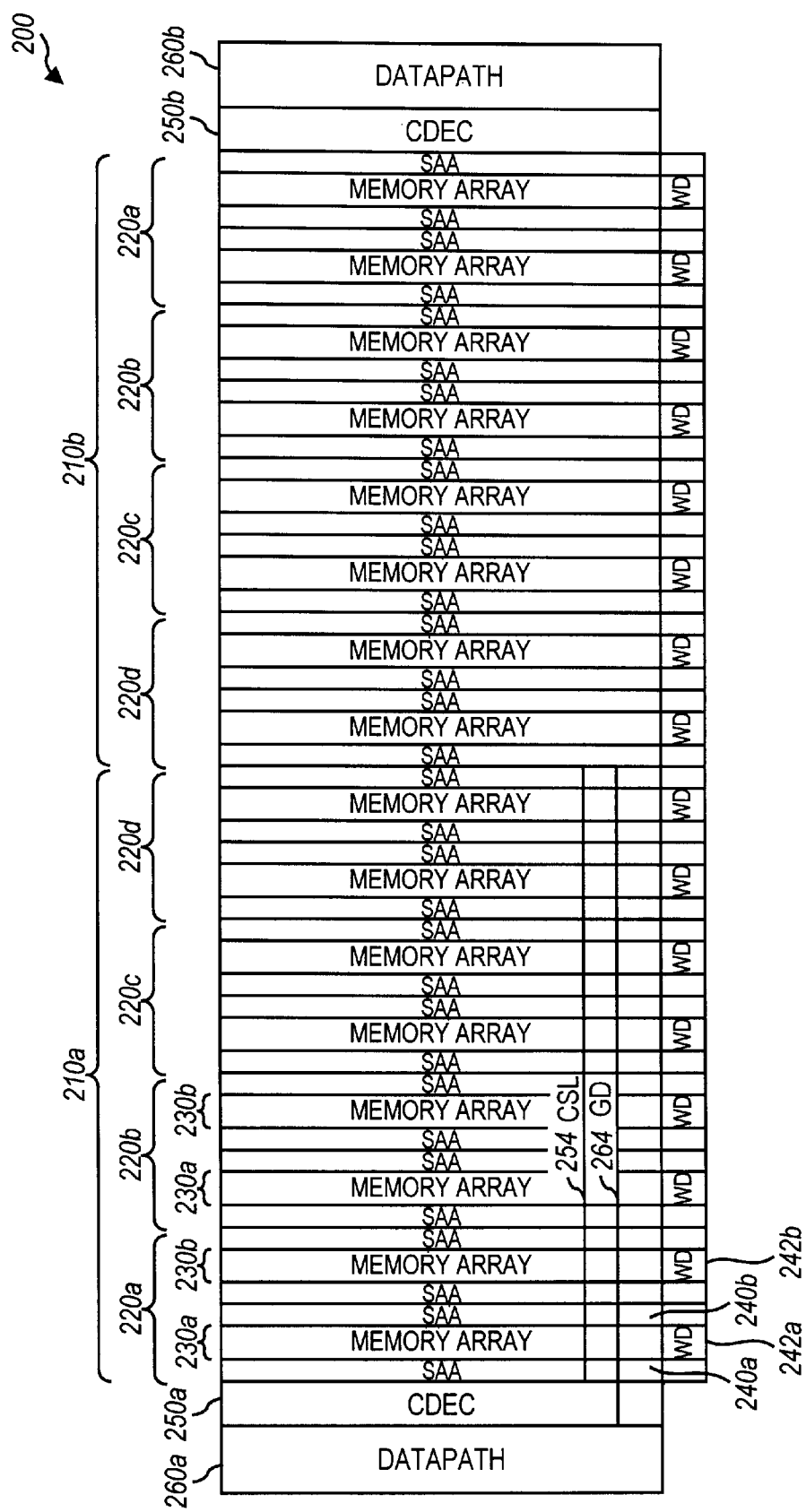
FIG. 2 shows a diagram of a specific embodiment of a DRAM.

FIG. 2 shows a diagram of a specific embodiment of a DRAM 200. DRAM 200 can represent DRAM 130 in FIG. 1. In the specific embodiment shown in FIG. 2, DRAM 200 includes two memory blocks 210a and 210b. Each memory block 210 includes four memory banks 220a through 220d, each memory bank 220 includes two memory arrays 230a and 230b, and each memory array 230 is associated with two sense amplifier arrays (SAAs) 240a and 240b. Generally, the memory device can include greater or fewer number of memory blocks, each memory block can include greater or fewer number of memory banks, and each memory bank can include greater or fewer number of memory arrays than that shown in FIG. 2. As an example, memory device 200 can be a 64-Mbit DRAM device having four memory blocks, with each memory block including eight memory banks and each memory bank including two memory arrays, whereby each memory array includes one million bits (Mbits) of memory. As another example, memory device 200 can be a 256-Mbit DRAM device having four memory blocks, with each memory block including eight memory banks and each memory bank including four memory arrays, whereby each memory array includes two Mbits of memory.

Each memory array 230 includes memory cells for many data bits. The memory cells are typically arranged in a two-dimensional array. A word line signal (WL) selects a particular row within the memory array, and a column select line (CSL) 254 selects a particular column. In a specific embodiment, each memory array 230 includes 512 columns and 512 word lines (plus some redundant columns and word lines). A word line driver (WD) 242 associated with each memory array 230 activates the WLs for that memory array. In the embodiment shown in FIG. 2, the CSLs for memory block 210a and 210b are activated by column decoders (CDECs) 250a and 250b, respectively. The WLs and CSLs are activated in accordance with a memory address provided by a source external or internal to memory device 200.

Datapaths 260a and 260b interconnect (via global data lines (GD) 264) the memory cells in the memory block to the input/output (I/O) pads (not shown in FIG. 2). Memory device 200 typically includes many CSLs 254 and global data lines 264, only one of each is shown in FIG. 2 for clarity.

DRAMs are common and popular in many computing systems for many reasons. Each memory cell in a DRAM can be implemented using a fraction of the die area of a memory cell for other types of memory (e.g., static RAM or SRAM). This allows more cells to be implemented in a particular circuit area. However, unlike a SRAM which permanently stores data, the memory cells within the DRAM need to be refreshed within a particular critical time period to avoid loss of data.

Figure 3:
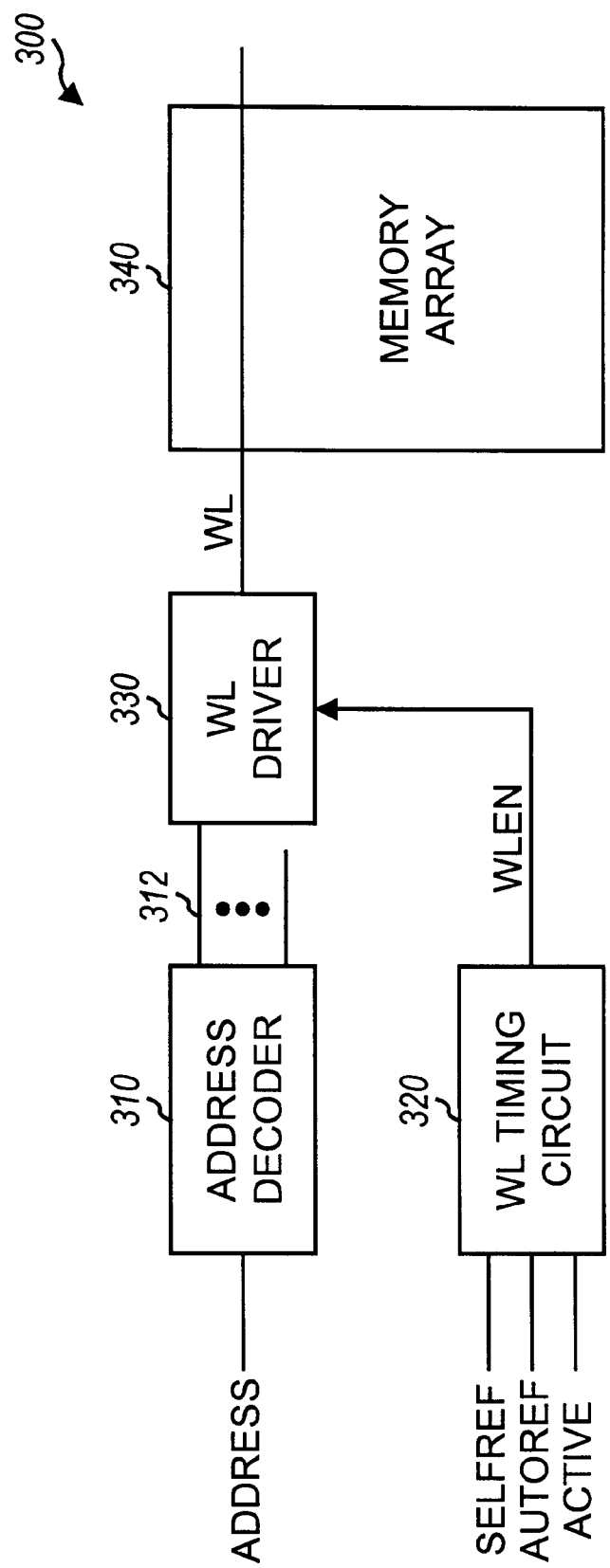
FIG. 3 shows a block diagram of a DRAM architecture that supports normal memory access and various refresh modes.

FIG. 3 shows a block diagram of a DRAM architecture that supports memory access and various refresh modes. Within a DRAM 300, an address ADDRESS (e.g., internally generated or from the address bus) is provided to an address decoder 310 that decodes the received address and activates a word line (WL) 312 corresponding to the address. A word line (WL) timing circuit 320 receives a set of control signals (e.g., SELFREF, AUTOREF, and ACTIVE) and generates a word line enable signal WLEN. The control signals SELFREF, AUTOREF, and ACTIVE direct timing circuit 320 to initiate a self-refresh operation, an auto-refresh operation, and a memory access, respectively. A word line driver 330 couples to decoder 310 via word line 312, receives the enable signal WLEN, and drives a word line in a memory array 340. The word line couples to a row of memory cells. The decoding and driver circuitry for the column select lines are not shown in FIG. 3 for clarity.

Several refresh modes are available for conventional DRAMs, including (1) CAS-before-RAS (CBR) refresh mode, (2) auto-refresh mode, and (3) self-refresh mode.

Figure 4A:
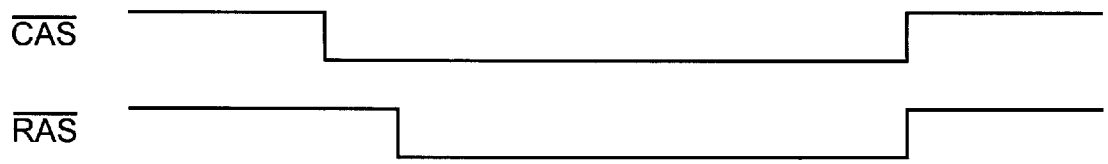
FIGS. 4A through 4C show timing diagrams for a CBR refresh operation, an auto-refresh operation, and a self-refresh operation, respectively.

FIG. 4A shows a timing diagram for a CBR refresh operation. A column address strobe (CAS) and a row address strobe (RAS) used for data access of the DRAM are also used for the DRAM refresh. For a CBR refresh operation, the CAS is initially activated (i.e., brought to logic low) and the RAS is activated shortly thereafter. When both strobes are activated, one or more rows of memory cells in the DRAM are refreshed. The CAS and RAS are then deactivated (i.e., brought to logic high) and the DRAM resumes normal operation. CBR refresh is conventionally employed for asynchronous DRAMs and extended data out (EDO) DRAMs. CBR refresh is described in further detail in U.S. Pat. No. 5,835,937, which is incorporated herein by reference. CBR operations are controlled by external commands. Each CBR operation refreshes a particular number of rows depending on the particular design of the DRAM. For example, if a DRAM design includes 64K of rows and is specified for 4K refresh, then each CBR operation refreshes 16 rows.

The CBR refresh mode typically includes a number of different modes. In a burst CBR mode, multiple CBR operations are performed until all rows are refreshed. The burst CBR mode can disrupt the normal operation of the DRAM, which may degrade performance. The burst CBR mode can also cause heating of the DRAM since a large number of operations are performed within a short time period. In a distributed CBR mode, a CBR operation is performed periodically based, in part, on the refresh time specification. Each refresh operation in the distributed CBR mode refreshes a particular number of rows. For both CBR modes, CBR operations are performed such that the specified refresh time (e.g., 64 msec/cell) is satisfied.

The CAS and RAS are activated to refresh one particular row of memory cells and are deactivated thereafter. The process is repeated for each row of memory. In a second CBR refresh mode, the CAS and RAS are activated for a prolonged time period so that multiple rows can be refreshed within one CBR refresh operation.

Figure 4B:
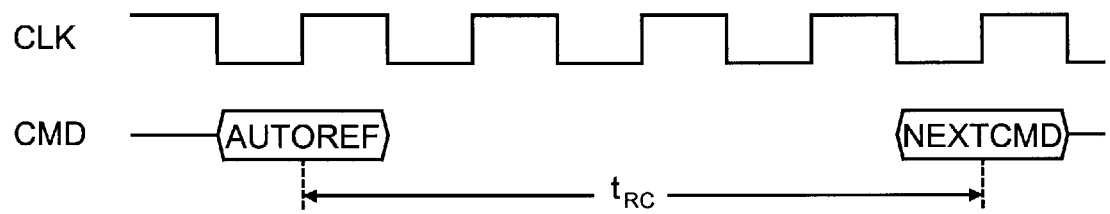

FIG. 4B shows a timing diagram for an auto-refresh operation. The DRAM initially receives a command to refresh one or more sets of rows of memory cells. Each set of row can include on or more rows of memory, depending on the particular DRAM architecture. An internal counter provides an address that can correspond to the selected set(s) of rows. The DRAM refreshes the indicated rows, one set of rows at a time, until the next command is received. Conventionally, the DRAM is placed into the auto-refresh mode by an external circuit (e.g., the DRAM controller). The auto-refresh mode is commonly used for synchronous DRAM.

Figure 4C:
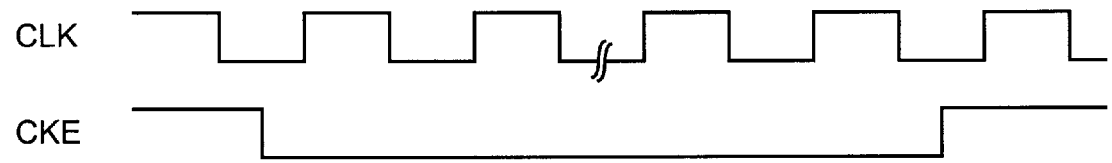

FIG. 4C shows a timing diagram for a self-refresh operation. The self-refresh mode may be activated, for example, if the computing system is in a power-down or power saving mode. In the self-refresh mode, a control logic internal to the DRAM issues a command to refresh and an internal counter generates a self-timed clock. The internal support circuitry then automatically (and sequentially) generates addresses for the self-refresh operation. The self-refresh mode allows the DRAM to preserve its stored states without an external command from the controller.

Several other refresh schemes are disclosed in U.S. Pat. No. 5,627,791, which is incorporated herein by reference. However, these refresh schemes generally require an external command to initiate the refresh operation.

Figure 5A:
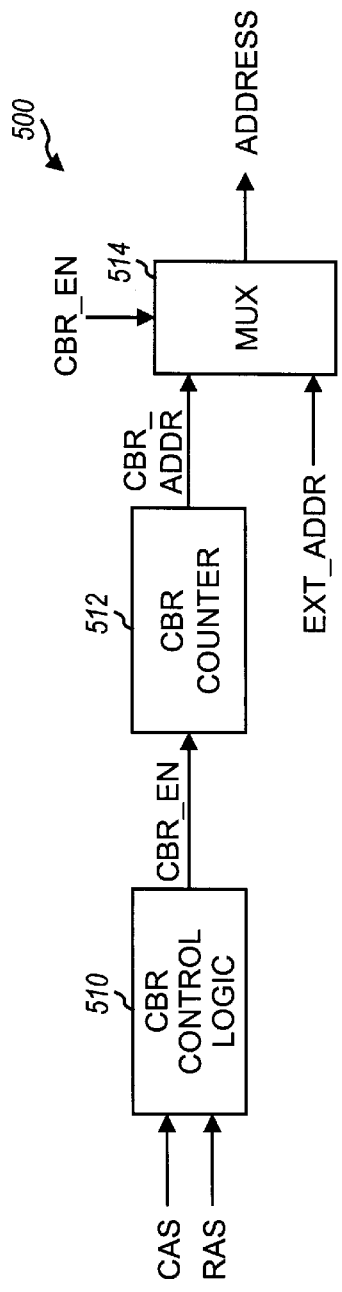
FIG. 5A shows a simplified block diagram of an embodiment of a refresh control circuit that supports CBR refresh.

FIG. 5A shows a simplified block diagram of an embodiment of a refresh control circuit 500 that supports CBR refresh. Control circuit 500 is typically implemented within the DRAM. Within control circuit 500, a CAS and a RAS are provided to a CBR control logic 510 that generates an enable signal CBR_EN. The CAS and RAS are typically provided by the DRAM controller.

A CBR counter 512 couples to CBR control logic 510, receives the enable signal CBR_EN, counts when enabled by the signal, and provides a counter value to MUX 514. The counter value represents an address of the row of memory cells to be refreshed, and is designated as CBR_ADDR. MUX 514 also receives an external address EXT_ADDR (i.e., from the address bus) used for a normal memory access of the DRAM. Depending on the state of the enable signal CBR_EN, MUX 514 selects either the external address or the counter value and provides the selected value to its output. The output of MUX 514 is provided to an address decoder (e.g., as shown in FIG. 3).

Figure 5B:
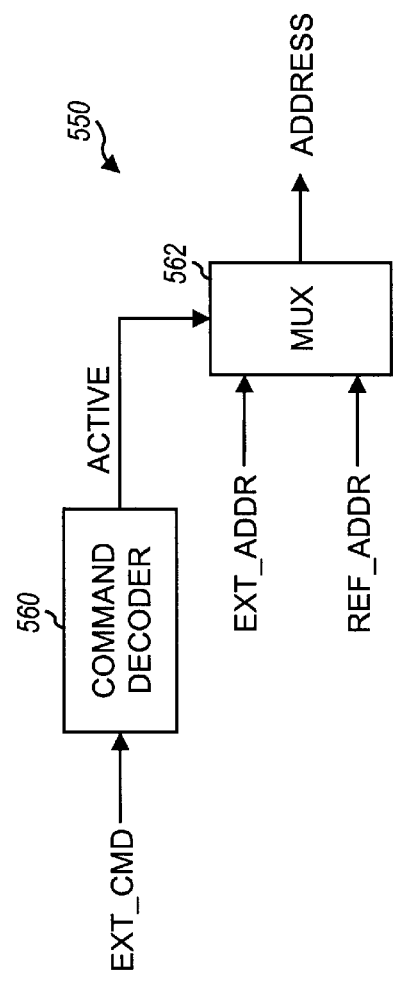
FIG. 5B shows a simplified block diagram of an embodiment of a refresh control circuit that supports auto-refresh.

FIG. 5B shows a simplified block diagram of an embodiment of a refresh control circuit 550 that supports auto-refresh. Control circuit 550 is also typically implemented within the DRAM. Within control circuit 550, a command decoder 560 receives and decodes an external command EXT_CMD and generates a control signal ACTIVE that indicates whether a row of memory is being accessed by an external circuit. A MUX 562 receives an external address EXT_ADDR and a refresh address REF_ADDR. The refresh address is generated internally by a counter such as CBR counter 512. Depending on the state of the control signal ACTIVE, MUX 562 selects either the external or the refresh address and provides the selected address ADDRESS to an address decoder (e.g., as shown in FIG. 3).

The CBR and auto-refresh modes require the external circuitry (i.e., the DRAM controller) to send the proper commands to initiate the refresh operation. This "supervision" by the external circuitry typically places addition burden on the design of the controller and/or processor. For some applications, it is advantageous to provide a refresh mechanism that automatically and transparently refreshes the DRAM without intervention by external circuitry. This allows the DRAM to operate in a manner similar to a SRAM, which does not require memory refresh.

The invention provides "transparent" refresh mechanisms for (e.g., synchronous) DRAM. In the transparent refresh mode, the DRAM internally and periodically generates a command to refresh while it is operating in normal manner and servicing memory accesses. In some embodiments, the refresh command can be generated based on one or a combination of "operational" signals provided to the DRAM to carry out normal DRAM functions. In a specific embodiment, the refresh command is generated based on a clock signal CLK provided to the DRAM. In another specific embodiment, the refresh command is generated based on a clock enable signal CKE. For example, if the clock enable signal CKE is asserted (i.e., to logic high), an internal timer may be enabled to activate transparent refresh. In some other embodiments, internal circuitry (e.g., a detection circuit) detects if the DRAM is idle and, if idle, triggers a timing circuit to activate transparent refresh operations. Detection of an idle DRAM can be achieved, for example, by monitoring the operational signals (e.g., the external command, the external address, and so on) provided to the DRAM. For clarity, the invention is described below for a clock-based transparent refresh embodiment.

Refreshes are performed on the memory cells within a critical time period before the risk (i.e., a probability) of data loss due to cell capacitor leakage exceeds a particular threshold. Transparent refresh can be used in place of the auto-refresh described above. The DRAM can be designed to operate in a transparent refresh mode at all time (e.g., as part of the default operating mode), only when directed by an external command, or as directed by a value stored in a mode register within the DRAM.

Figure 6:
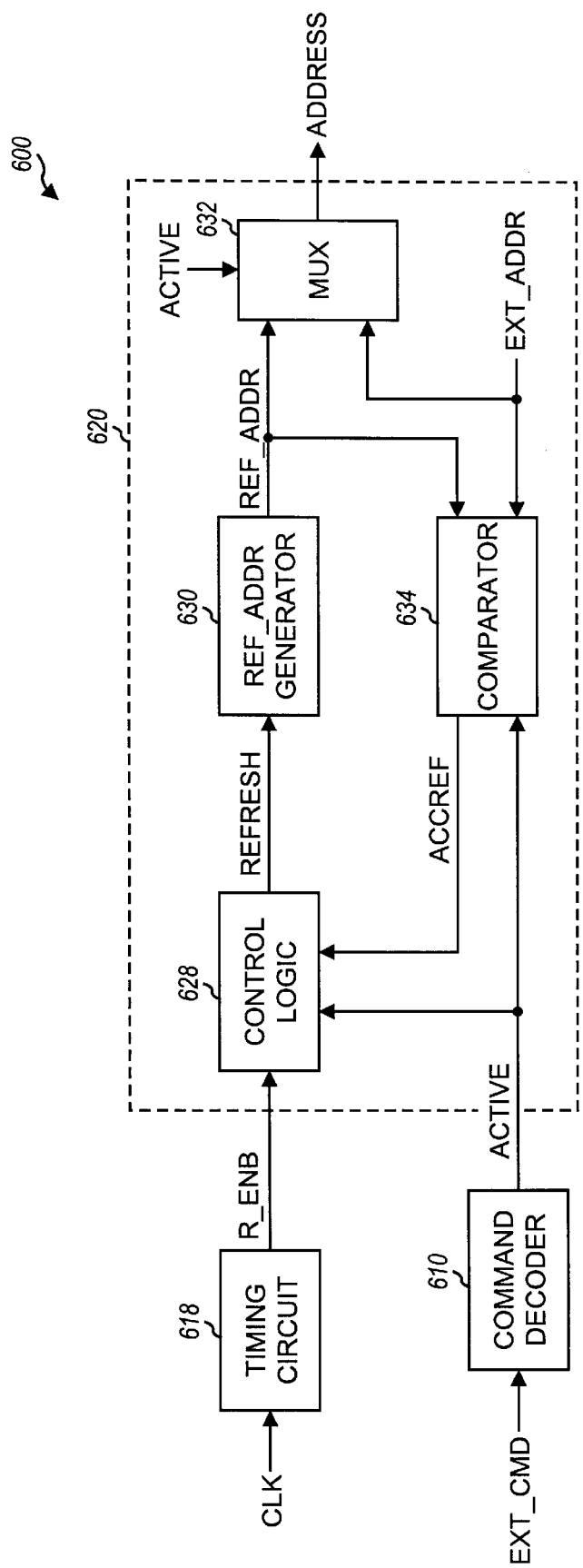
FIG. 6 shows a simplified block diagram of a specific embodiment of a refresh control circuit that supports a clock-based transparent refresh mode for a synchronous DRAM.

FIG. 6 shows a simplified block diagram of a specific embodiment of a refresh control circuit 600 that supports clock-based transparent refresh for a (e.g., synchronous) DRAM. Refresh control circuit 600 typically resides within the DRAM. Alternatively, refresh control circuit 600 can be located within the DRAM controller or other external circuitry.

As indicated in the specific embodiment shown in FIG. 6, an external command EXT_CMD is provided to a command decoder 610 that generates a control signal ACTIVE that indicates whether the DRAM is being accessed by an external circuit. A clock signal CLK is provided to a timing circuit 618 that generates a refresh enable signal R_ENB based on the clock signal. The clock signal CLK is used by the DRAM for normal memory access, and is typically available to the DRAM at all times during its active operation. The refresh enable signal R_ENB enables internal refresh operations and is asserted at specific time periods during which refresh operations are allowed.

In an embodiment, the refresh enable signal R_ENB includes an enable pulse for each refresh time period. The refresh time period can be defined as a particular number of clock cycles (e.g., three, or five, or ten clock, or other number of cycles). The enable pulse can have a duration of one or more clock cycles. Typically, the DRAM includes a $t_{RC}$ specification that limits the rate of the enable pulses. Specifically, the DRAM is normally not allowed to generate two refresh commands (which may be akin to generating two refresh pulses) within any particular time interval of $t_{RC}$. For example, if $t_{RC}$ is specified as 50 nsec and the clock period is 5 nsec, then timing circuit 618 generates one enable pulse for every ten or more clock cycles.

Within a control circuit 620, the control signal ACTIVE and the enable signal R_ENB are provided to a control logic 628 that also receives a control signal ACCREF. Based on these signals, control logic 620 generates a refresh control signal REFRESH that controls refresh of the DRAM. The control signal REFRESH is provided to a refresh address (REF_ADDR) generator 630. When enabled by the control signal REFRESH, generator 630 updates the refresh address (e.g., by incrementing or decrementing a counter value) and provides the updated refresh address REF_ADDR to a MUX 632. Generator 630 allows the DRAM to keep track of the current refresh address. MUX 632 receives an external address EXT_ADDR (e.g., from the address bus) and the refresh address REF_ADDR. Depending on the state of the control signal ACTIVE, MUX 632 selects either the external or refresh address and provides the selected address to an address decoder (e.g., as shown in FIG. 3). A comparator 634 receives the external address EXT_ADDR and the internally generated refresh address REF_ADDR, compares the addresses, and provides the control signal ACCREF. The control signal ACCREF is asserted if the external address is the same as the internal address. Thus, ACCREF may also be viewed as an indicator signal. In an embodiment, comparator 634 also receives the control signal ACTIVE and performs the address comparison when the control signal ACTIVE is asserted.

The specific embodiment shown in FIG. 6 includes the control signals ACTIVE, ACCREF, and REFRESH and the enable signal R_ENB that control the operation of the DRAM, i.e., direct the DRAM to perform a refresh operation or to service a memory access requested by an external circuit. Table 1 summarizes the states of the signals and the corresponding DRAM actions for a specific implementation. Other implementations are possible and are within the scope of the invention.

TABLE 1

| Control and Enable Signals | | | |
|---|---|---|---|
| ACTIVE | ACCREF | R_ENB | Operation |
| H | H | H | Memory Access and Refresh |
| H | L | H | Memory Access |
| H | X | L | Memory Access |
| L | X | H | Refresh |
| L | X | L | No Refresh |

As shown in Table 1, a refresh can be performed if the enable signal R_ENB is asserted. When no memory access is performed on the DRAM, as indicated by the control signal ACTIVE being not asserted, the refresh is performed using the internal refresh address. During a memory access, a refresh can be performed on the same set of rows that is being accessed by the external circuit. The control signal ACCREF ensures this condition and is asserted whenever: (1) the control signal ACTIVE is not asserted, or (2) the control signal ACTIVE is asserted and the external and refresh addresses are the same. The control signal REFRESH controls the update of the refresh address, which is updated to a new value if a refresh of the current address has been performed. In an embodiment, the control signal REFRESH is asserted if: (1) the control signal R_ENB is asserted, and (2) either the control signal ACTIVE is not asserted or the control signal ACCREF is asserted.

For improved performance, refresh control circuit 600 gives preference to a memory access over a refresh operation. Thus, in an embodiment, when the control signal ACTIVE is asserted, a memory access is performed regardless of the states of other signals.

In some embodiments, a refresh operation can be initiated only when the enable signal R_ENB is high. Thus, when the enable signal R_ENB is low, no refresh operations are performed regardless of the logic states of other signals. When the control signals ACTIVE and ACCREF are both asserted, indicating a memory access to the same set of rows that is to be refreshed, memory access and refresh operations can both be performed.

The specific embodiment shown in FIG. 6 allows for either a memory access or a refresh of a set of rows of memory, when enabled, at any particular clock cycle. For many DRAM architectures, a memory access is performed on one set of rows of memory on any given clock cycle. As shown in FIG. 2, many DRAM architectures include multiple blocks of memory, with each block including multiple banks of memory, and each bank including multiple memory arrays. Thus, refresh control circuits can be designed to allow for memory access and refresh, concurrently, on different sets of rows of the DRAM.

Figure 7:
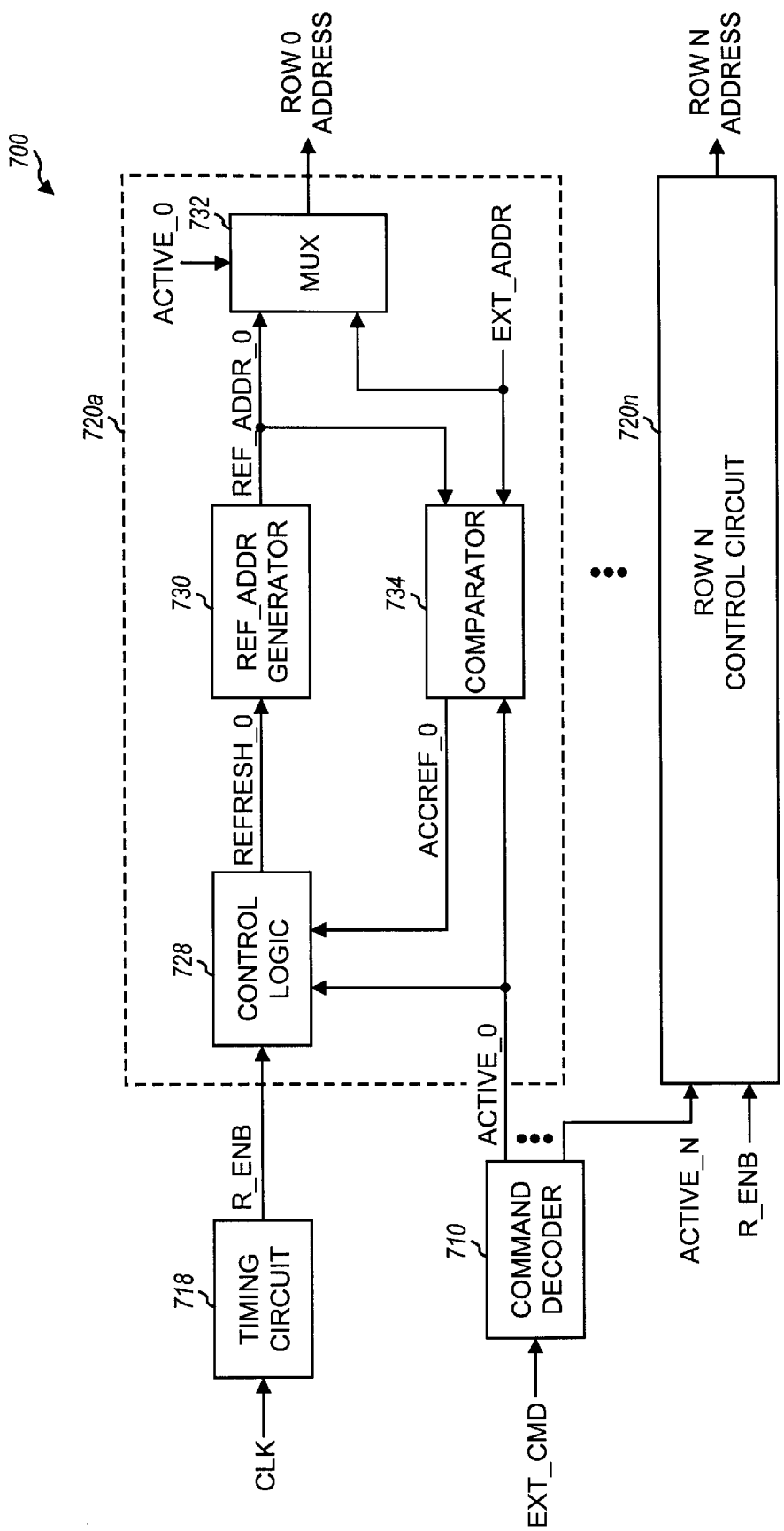
FIG. 7 shows a simplified block diagram of a specific embodiment of a refresh control circuit that supports concurrent memory access and clock-based transparent refresh.

FIG. 7 shows a simplified block diagram of a specific embodiment of a refresh control circuit 700 that supports concurrent memory access and clock-based transparent refresh. Refresh control circuit 700 typically resides within the DRAM, or can be located within the DRAM controller or other external circuitry.

As indicated in the specific embodiment shown in FIG. 7, an external command EXT_CMD is provided to a command decoder 710 that generates a set of control signals ACTIVE_0 through ACTIVE_N, one control signal for each memory bank. Each control signal ACTIVE_x (where "x" denotes the designation 0 . . . N of the particular memory bank) indicates whether memory bank x is being accessed by an external circuit. A clock signal CLK is provided to a timing circuit 718 that generates a refresh enable signal R_ENB based on the clock signal. The refresh enable signal R_ENB enables internal refresh operations and can be generated in the manner described above.

As shown in FIG. 7, refresh control circuit 700 includes a number of row control circuits 720a through 720n. In a specific embodiment, one row control circuit 720 is associated with each bank of memory. In many DRAM architectures, a memory access is performed on a set of rows of a particular memory bank on any particular clock cycle. The use of a row control circuit for each memory bank allows for maintenance of a separate refresh address for each memory bank. For some DRAM architectures, multiple row control circuits can allow for memory access of a particular memory bank and concurrent refresh of remaining unaccessed memory banks. In another specific embodiment, one row control circuit is provided for each memory block. In general, each row control circuit 720 can be designed to control any number of memory cells, or any defined section of the DRAM.

In the specific embodiment shown in FIG. 7, within each row control circuit 720, the control signal ACTIVE_x and the enable signal R_ENB are provided to a control logic 728 that also receives a control signal ACCREF_x. Based on these signals, control logic 728 generates a refresh control signal REFRESH_x in similar manner as described above.

The control signal REFRESH_x is provided to a refresh address (REF_ADDR) generator 730. In an embodiment, generator 730 is implemented with a counter. When enabled by the control signal REFRESH_x, generator 730 updates the refresh address and provides the updated refresh address REF_ADDR_x to a MUX 732. Generator 730 allows each row control circuit 720 to keep track of the current refresh address for the particular section of memory assigned to that row control circuit.

MUX 732 receives the external address EXT_ADDR and the refresh address REF_ADDR. Depending on the state of the control signal ACTIVE_x, MUX 732 selects either the external or refresh address and provides the selected address to an address decoder (not shown in FIG. 7) that activates the row or word line corresponding to that address. A comparator 734 receives the external address EXT_ADDR_x and the internally generated refresh address REF_ADDR _x, compares the addresses, and provides the control signal ACCREF_x. The control signal ACCREF_x is asserted if the external address is the same as the internal address. In an embodiment, comparator 734 also receives the control signal ACTIVE_x and performs the address comparison when the control signal ACTIVE_x is asserted.

The specific embodiment shown in FIG. 7 includes the control signals ACTIVE, ACCREF, and REFRESH and the enable signal R_ENB that control the operation of the DRAM. Table 2 summarizes the states of the signals and the corresponding DRAM actions for a specific implementation. Other implementations are possible and are within the scope of the invention.

TABLE 2

| Control and Enable Signals | | | |
|---|---|---|---|
| ACTIVE | ACCREF | R_ENB | Operation |
| H | H | H | Memory Access and Refresh |
| H | L | H | Memory Access and Refresh of non-active Memory Blocks |
| H | X | L | Memory Access |
| L | X | H | Refresh |
| L | X | L | No Refresh |

Refresh control circuit 700 can be operated in various manners. In one embodiment, only one row control circuit 720 is active at any given moment (e.g., only one of the control signals ACTIVE_0 through ACTIVE_N is asserted at any Given time). In this embodiment, the memory access and refinish operations are performed in similar manner as that described for FIG. 6. However, each row control circuit 720 is able to maintain a separate refresh address for the section of memory assigned to that row control circuit, which can improve the refresh performance of the DRAM.

In another embodiment, each row control circuit 720 is designed to perform refresh of a set of rows of memory whenever: (1) the enable signal R_ENB is activated and (2) either the control signal ACTIVE is not asserted or the control signal ACCREF is asserted. For some DRAM architectures, this can allow flexible memory access and refresh operations. Conventional DRAM architectures access a set of rows from one bank of memory on any give clock cycle. With properly designed DRAMs, refresh control circuit 700 can support concurrent memory access and refresh of remaining non-active memory sections. For example, a particular memory section can be accessed and another memory section can be refresh concurrently. Also, multiple memory sections (e.g., a selected number or all memory banks or blocks) can be refreshed at any particular moment. The selected memory sections can be refreshed concurrently or at different times (i.e., staggered).

The memory access and refresh operation are described with regard to memory sections. However, the invention is applicable to various memory architectures, regardless of the definition of the memory section. For example, each memory section can correspond to one or a number of memory banks, memory blocks, or memory arrays. Generally, the refresh control circuit of the invention can be designed to operate in conjunction with any DRAM architecture.

Various modifications can be made to the specific embodiments shown in FIGS. 6 and 7. For example, the CBR refresh control circuit in FIG. 5A and the auto-refresh control circuit in FIG. 5B can be incorporated with the refresh control circuit. An internal counter can be provided to generate a self-timed clock to operate the synchronous internal circuitry within the refresh control circuit.

The refresh control circuit can also be designed to process an "active" command in various manners. The active command is received when a memory access is to be performed, and is indicated by the control signal ACTIVE being asserted. In a specific embodiment, if an active command is received, the timing circuit (e.g., timing circuits 618 and 718) can be interrupted (i.e., temporarily halted) so that a refresh cannot be performed at the same time the DRAM is being accessed. For this embodiment, the timing circuit can receive a signal from the command decoder, which is indicated by the dashed line in FIGS. 6 and 7, and can generate the refresh enable signal based, in part, on this signal. In another specific embodiment, the memory access and refresh operations can be performed within the same time period, so that the timing circuit does not need to be interrupted. A DRAM architecture that support a quick memory access is disclosed in U.S. Pat. application Ser. No. 09/352,543, entitled "Low Latency Memory Sensin, Circuits," filed Jul. 12, 1999, assigned to the assignee of the present invention, and incorporated herein by reference. This application describes latching the sensed data with an intermediate latch, thereby quickly freeing the row for a precharge operation within the same access cycle.

In a specific embodiment, the timing circuit periodically generates one refresh enable pulse for each refresh time period, which is defined by a particular number of clock cycles. For example, one enable pulse can be generated every three, or five, ten, or other number of clock cycles.

In another specific embodiment, the refresh enable pulse can be generated based on a received clock edge and one or more delay elements within the DRAM. Each delay element provides a particular delay period. One delay element can be used to control the duration between refresh enable pulses, and can be triggered by the received clock edge. Another delay element can be used to control the width of the refresh enable pulse. Generation of the refresh enable pulse using delay elements may be advantageous, for example, when fixed intervals and/or pulse width are desired regardless of the frequency of the clock signal CLK provided to the DRAM.

As noted above, the memory refresh is performed within the critical time period for each memory cell having data stored therein, to prevent loss of data. In normal operation, it may be possible that a particular bank of memory is accessed for an extended period of time, thus preventing refresh of the memory cells in that bank within the critical time period. In accordance with an aspect of the invention, several mechanisms are provided to ensure that memory cells containing valid data are refreshed within the critical time period to avoid loss of data.

In one mechanism, a specification is placed on the DRAM to limit the duration of the active command (e.g., to the same memory section). More specifically, the time between the active command and the precharge of memory cells in a particular memory section is specified as a particular time limit that is less than the critical time period. This ensures that some time will be available for memory refresh.

In another mechanism, the DRAM initiates a refresh of the memory cell when the critical time period approaches and sends a status signal to the external circuits (e.g., the DRAM controller). The status signal can be generated, for example, by control logic 628 and 728. The status signal indicates that the DRAM is busy, or that the accessed data is not yet available. This is similar to placing the controller or processor in the idle state while the DRAM is performing its operations.

A memory access may be requested while an internal refresh is being performed. Several mechanisms are also provided for this situation.

In one mechanism, when a refresh is being performed, a status signal is provided from the DRAM to indicate that the DRAM is busy or that memory access is not permitted. The external circuits then wait until the refresh operation is completed before issuing the memory access command.

In another mechanism, the external circuits provide the memory access command a particular time period prior to the time the memory access is needed. The DRAM receives the command and can stop or finish up the current refresh operation. The DRAM can also inhibit pending or future refresh operations (e.g., those operations that cannot be completed by the time of the memory access), until the requested memory access is completed. This mechanism is also referred to as a post active memory access.

In yet another mechanism, the DRAM receives and stores the memory access command and the external address when a memory access cannot be performed as requested. The DRAM then performs the memory access when possible (e.g., after the current refresh operation is completed). This mechanism is also referred to as a delay active memory access.

The invention provides transparent DRAM refresh operations that are preferred by some applications. One such application is in the area of embedded DRAM technologies in which it is desirable to implement DRAM blocks capable of performing transparent refresh without assistance from a controller and having minimal impact to normal operations. Such a DRAM block can provide the advantages of conventional DRAMs (i.e., high density and low cost) and, at the same time, be operated in a manner similar to a conventional static RAM (SRAM) that does not require refresh of its memory cells.

The clock-based transparent refresh of the invention provides many advantages. Since the refresh is self-initiated, no external refresh commands are needed from external circuits. This reduces the overhead required to maintain the DRAM. The transparent refresh capability also allows the DRAM to emulate an SRAM. The DRAM of the present invention thus enjoys simplicity of operation (i.e., similar to the SRAM) with the density and cost benefits of conventional DRAM.

The foregoing description of the specific embodiments is provided to enable any person skilled in the art to make or use the invention. Various modifications to these embodiments will be readily apparent to those skilled in the art, and the generic principles defined herein may be applied to other embodiments without the use of the inventive faculty. Thus, the specific implementation details described herein are intended to be illustrative, and not limitations, of the present invention. Accordingly, the invention is not intended to be limited to the embodiments shown herein but is to be accorded the widest scope consistent with the principles and novel features disclosed herein, and as defined by the following claims.

What is claimed is:

1. A refresh control circuit for a dynamic random access memory (DRAM) comprising:
   a timing circuit configured to provide a refresh enable signal;
   a control logic coupled to the timing circuit, the control logic configured to receive the refresh enable signal and a command control signal and to provide a refresh control signal;
   an address generator coupled to the control logic, the address generator configured to receive the refresh control signal and provide a refresh address; and
   a multiplexer coupled to the address generator, the multiplexer configured to receive the refresh address and an external address and to provide one of the received addresses as an output address,
   wherein the refresh control circuit initiates refresh of selected memory cells within the DRAM in time periods between memory accesses of the DRAM.

2. The circuit of claim 1, further comprising:
   a comparator configured to receive the external address and the refresh address and to generate, based in part on the addresses, an indicator signal that indicates whether the received external and refresh addresses are the same, and
   wherein the control logic is further configured to receive the indicator signal and to generate the refresh control signal based, in part, on the received indicator signal.

3. The circuit of claim 1, wherein the timing circuit is configured to receive at least one operational signal and to generate the refresh enable signal in response thereto.

4. The circuit of claim 1, wherein the timing circuit is configured to receive a clock signal and to generate the refresh enable signal based, in part, on the received clock signal.

5. The circuit of claim 4, wherein the refresh enable signal is activated for a particular number of clock cycles for each refresh time period.

6. The circuit of claim 4, wherein the refresh enable signal is activated for one clock cycle for each refresh time period.

7. The circuit of claim 5, wherein the refresh time period is defined to be shorter than a critical time period for the DRAM, the critical time period corresponding to a time period within which a memory refresh needs to be performed before a probability of data loss exceeds a particular threshold.

8. The circuit of claim 1, further comprising:
a command decoder configured to receive an external command signal and generate the command control signal, wherein the command control signal indicates a memory access of the DRAM.

9. The circuit of claim 8, wherein the external command is received a particular time period prior to a requested memory access.

10. The circuit of claim 8, wherein the external command is stored if a memory access cannot be performed at the time of request.

11. The circuit of claim 1, wherein the address generator is updated if a refresh operation is performed.

12. The circuit of claim 1, wherein the address generator includes a counter that is enabled by the refresh control signal.

13. The circuit of claim 1, wherein the timing circuit is disabled when a memory access of the DRAM is performed.

14. The circuit of claim 1, wherein the control logic is further configured to provide a status signal indicating a refresh operation is being performed.

15. The circuit of claim 1, wherein the DRAM is specified such that memory access to a particular section of memory is limited to a particular maximum access time period.

16. The circuit of claim 1, wherein the refresh control circuit is configured to provide, when enabled, an address for either a memory access or a memory refresh.

17. The circuit of claim 1, wherein the DRAM is synchronous.

18. An embedded DRAM comprising the refresh control circuit of claim 1.

19. A refresh control circuit for a dynamic random access memory (DRAM) comprising:
a timing circuit configured to provide a refresh enable signal; and
at least one row control circuit coupled to the timing circuit, each row control circuit configured to receive the refresh enable signal and a respective command control signal and to provide a respective output address, each row control circuit including
a control logic configured to receive the refresh enable signal and the command control signal and to provide a refresh control signal,
an address generator coupled to the control logic, the address generator configured to receive the refresh control signal and provide a refresh address, and
a multiplexer coupled to the address generator and configured to receive the refresh address and an external address and to provide one of the received addresses as the output address.

20. The circuit of claim 19, wherein the refresh control circuit initiates refresh of selected memory cells within the DRAM in time periods between memory accesses of the DRAM.

21. The circuit of claim 19, wherein each row control circuit provides, when enabled, an address for either a memory access or a memory refresh for a section of the DRAM associated with the row control circuit.

22. The circuit of claim 19, wherein the refresh control circuit includes two or more row control circuits, and wherein the row control circuits are configurable to concurrently provide, when enabled, addresses for either memory access or memory refresh for respective sections of the DRAM associated with the row control circuits.

23. The circuit of claim 19, wherein each row control circuit further includes:
a comparator configured to receive the external address and the refresh address and to generate an indicator signal that indicates whether the external and refresh addresses are the same.

24. The circuit of claim 19 further comprising:
a command decoder configured to receive an external command signal and generate the command control signal, wherein the command control signal indicates a memory access of the DRAM.

25. An embedded DRAM comprising the refresh control circuit of claim 19.

26. A method for performing refresh of a memory cell within a memory circuit, the method comprising:
generating a refresh enable signal within the memory circuit in time periods between memory accesses of the memory circuit;
providing a refresh control signal in response to the refresh enable signal and a command control signal;
generating a refresh address based, in part, on the refresh control signal, wherein the refresh address indicates locations of memory cells to be refreshed;
selecting either the refresh address or an external address; and
providing the selected address as an output address.

27. The method of claim 26, wherein the refresh enable signal is activated periodically based on a received clock signal.

28. The method of claim 27, wherein the command control signal indicates a memory access of one or more memory cells.

29. The method of claim 26, wherein the refresh control signal indicates a permitted refresh of the memory cells.

30. The method of claim 26, further comprising:
providing a status signal indicative of a refresh operation being performed.

31. The method of claim 26, wherein the refresh enable signal is generated based on at least one received operational signal.

32. The method of claim 26, wherein the refresh enable signal is generated based on an operational state of the memory circuit.

33. The method of claim 32, wherein the refresh enable signal is generated based on the memory circuit being in an inactive state.

34. The method of claim 26, further comprising
initiating a refresh operation within a particular time period prior to expiration of a critical time period for the memory circuit.

35. The method of claim 34, further comprising:
providing a status signal indicative of the initiated refresh operation.

36. The method of claim 26, wherein the memory circuit is a DRAM.

37. The method of claim 26, wherein the memory circuit is a synchronous DRAM.

38. The circuit of claim 1, wherein the refresh control circuit initiates a refresh operation within a particular time period prior to expiration of a critical time period for the DRAM.

39. The circuit of claim 38, wherein the refresh control circuit further provides a status signal indicative of the initiated refresh operation.

40. The circuit of claim 1, wherein the refresh enable signal is generated based on an operational state of the DRAM.

41. The circuit of claim 40, wherein the refresh enable signal is generated based on the DRAM being in an inactive state.

* * * * *